(12) United States Patent
Wyville

(10) Patent No.: US 8,909,185 B2
(45) Date of Patent: Dec. 9, 2014

(54) FREQUENCY AGILE FILTER USING A DIGITAL FILTER AND BANDSTOP FILTERING

(71) Applicant: Rockstar Consortium US LP, Plano, TX (US)

(72) Inventor: Mark Wyville, Ottawa (CA)

(73) Assignee: Rockstar Consortium US LP, Plano, TX (US)

( * ) Notice: Subject to any disclaimer, the term of this patent is extended or adjusted under 35 U.S.C. 154(b) by 2 days.

(21) Appl. No.: 13/751,599

(22) Filed: Jan. 28, 2013

(65) Prior Publication Data

US 2013/0149982 A1 Jun. 13, 2013

Related U.S. Application Data

(63) Continuation of application No. 13/131,918, filed as application No. PCT/CA2009/001721 on Nov. 26, 2009, now Pat. No. 8,385,871.

(60) Provisional application No. 61/118,686, filed on Dec. 1, 2008, provisional application No. 61/119,090, filed on Dec. 2, 2008, provisional application No. 61/262,638, filed on Nov. 19, 2009.

(51) Int. Cl.

| H04B 1/18 | (2006.01) |
|---|---|
| H04B 1/52 | (2006.01) |
| H04L 25/08 | (2006.01) |
| H03H 11/34 | (2006.01) |
| H04B 1/10 | (2006.01) |

(52) U.S. Cl.
CPC ............ *H04L 25/08* (2013.01); *H04B 1/525* (2013.01); *H03H 11/344* (2013.01); *H04B 1/1027* (2013.01); *H04B 1/10* (2013.01)

USPC ............ 455/280; 455/78; 455/286; 455/306; 370/320; 330/151

(58) Field of Classification Search
CPC .................................. H04B 1/10; H04B 1/525
USPC ................ 455/280, 78, 286, 306, 307, 189.1; 370/320; 330/151
See application file for complete search history.

(56) References Cited

U.S. PATENT DOCUMENTS 5,130,663 A * 7/1992 Tattersall, Jr. .................. 330/52
6,998,916 B2 * 2/2006 Hunton et al. ................ 330/151
(Continued)

FOREIGN PATENT DOCUMENTS

| CN | 1066349 A1 | 11/1992 |
| WO | 9319524 A1 | 9/1993 |

(Continued)

OTHER PUBLICATIONS

English_Translation_of_1st_Chinese_Office_Action and Chinese Search Report for Chinese Serial No. 200980156268.1, dated Aug. 26, 2013 and 1st_Chinese_Language Chinese Office Action and Search Report consisting of 11-pages.

(Continued)

*Primary Examiner* — Sanh Phu
(74) *Attorney, Agent, or Firm* — Christopher & Weisberg, P.A.

(57) ABSTRACT

A method of providing frequency dependent signal attenuation. An RF input signal is split into a first signal portion and a second signal portion. Discrete time filtering, a negative group delay and bandstop filtering are applied to the first signal portion to provide a filtered signal portion. The second signal portion is applied to a component, and a component output signal portion is received from the component. The component output signal portion is combined with the filtered signal portion to provide an RF output signal having frequency dependent attenuation.

20 Claims, 7 Drawing Sheets

(56) References Cited

U.S. PATENT DOCUMENTS

| | | | |
|---|---|---|---|
| 2004/0062216 A1* | 4/2004 | Nicholls et al. | 370/320 |
| 2007/0298838 A1 | 12/2007 | Meiyappan et al. | |
| 2008/0113617 A1 | 5/2008 | Braithwaite | |
| 2009/0227213 A1* | 9/2009 | Sadeghfam et al. | 455/78 |
| 2010/0325669 A1* | 12/2010 | Tsai et al. | 725/68 |

FOREIGN PATENT DOCUMENTS

| | | | |
|---|---|---|---|
| WO | 98/35439 | A1 | 8/1998 |
| WO | 2007/149957 | A1 | 12/2007 |
| WO | 2007149957 | A1 | 12/2007 |

OTHER PUBLICATIONS

Supplementary European Search Report dated Oct. 21, 2013 for corresponding European Application Serial No. 09829909.2, European Filing Date: Jun. 14, 2011, consisting of 7 pages.

Japanese Examination Report in both Japanese and its English translation dated May 21, 2013 for corresponding Japanese National Stage Application Serial No. 2011-537805, Japanese National Stage Entry Date: May 27, 2011, consisting of 5 pages.

International Search Report and Written Opinion dated Jan. 25, 2010 for International Application Serial No. PCT/CA2009/001721, International Filing Date: Nov. 26, 2009 consisting of 8-pages.

Japanese Final Rejection in both Japanese and its English translation dated Mar. 25, 2014 for corresponding Japanese National Stage Application Serial No. 2011-537805, Japanese National Stage Entry Date: May 27, 2011, consisting of 3 pages.

2nd Chinese Examination Report in both Chinese and its English translation dated May 13, 2014 for corresponding Chinese National Stage Application Serial No. 200980156268.1, Chinese National Stage Entry Date: Aug. 1, 2011, consisting of 4 pages.

* cited by examiner

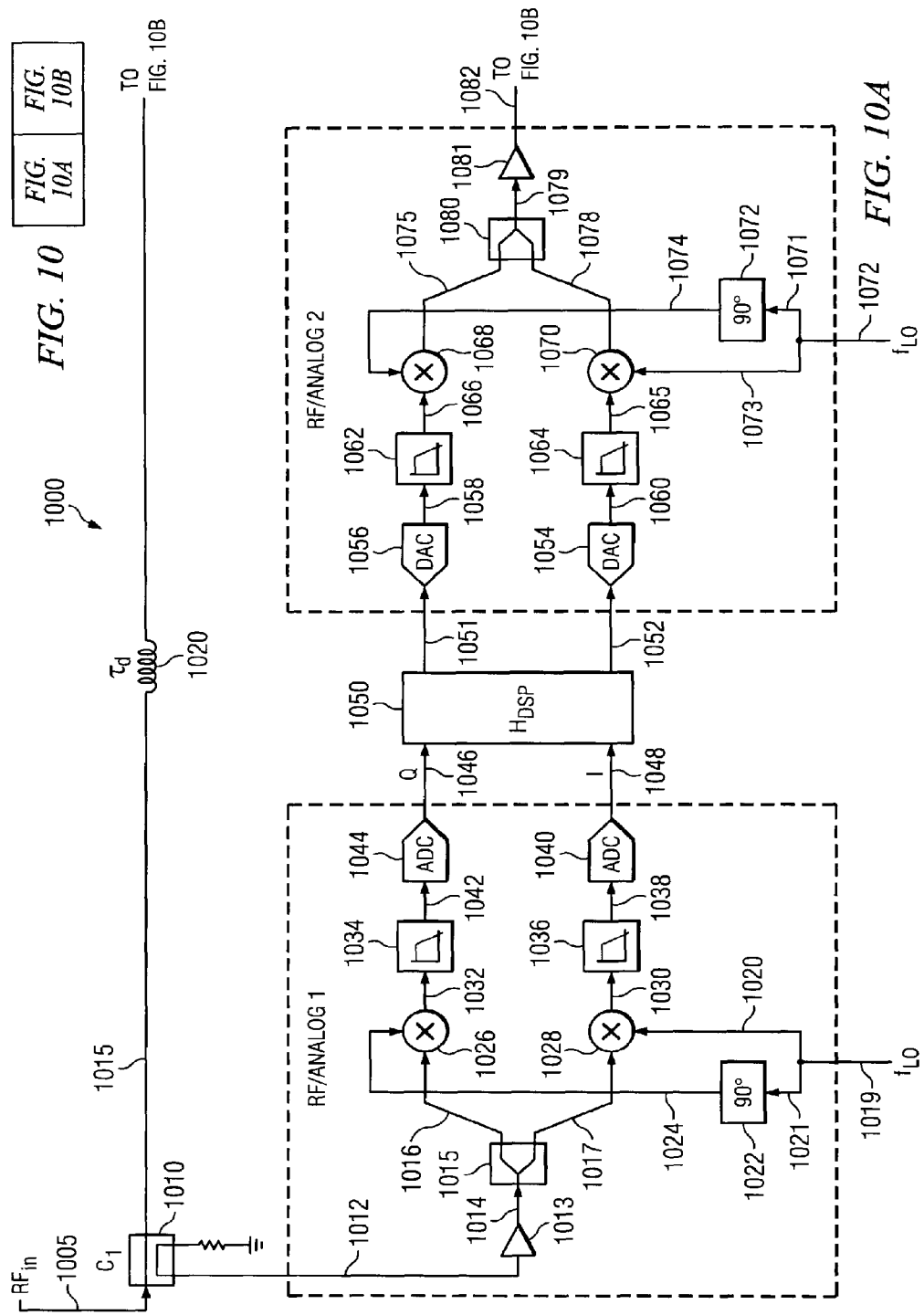

FREQUENCY AGILE FILTER USING A DIGITAL FILTER AND BANDSTOP FILTERING

CROSS-REFERENCE TO RELATED APPLICATIONS

This application is a Continuation of U.S. Ser. No. 13/131,918, filed May 31, 2011 which is a U.S. National Stage Patent Application of International Application Number: PCT/CA2009/001721, filed Nov. 26, 2009 entitled "FREQUENCY AGILE FILTER USING A DIGITAL FILTER AND BANDSTOP FILTERING," which claims priority to U.S. Provisional Application Ser. Nos. 61/118,686, filed Dec. 1, 2008, 61/119,090, filed Dec. 2, 2008, and 61/262,638, filed Nov. 19, 2009, the entirety of which all are incorporated herein by reference.

TECHNICAL FIELD OF THE INVENTION

The present invention relates to a frequency agile duplex filter for use in RF filters and signal cancellation in a wireless communication system, multiband radio architecture, system capable of spectrum re-farming and software defined radio.

BACKGROUND OF THE INVENTION

Presently used RF filters in base stations include mechanically tunable RF filters. These filters are coupled-cavity filters with low-loss, high dynamic range and superior selectivity, but requiring mechanical tuning limits the reconfigurability of the filter in terms of carrier frequency range. What is needed is a filter and signal cancellation system that eliminates the need for mechanical tuning.

Feed-forward configurations of RF discrete-time filters are also available. A known three path RF discrete-time feed-forward filter system is shown in FIG. 1 for improving duplexer isolation. In this figure, $h_1$ and $h_2$ are system blocks containing vector modulators. The symbols labeled $\tau_1$ and $\tau_2$ are fixed delay lines, which classifies this system as discrete-time.

The known RF discrete-time filters consist of RF paths containing tunable phase shifters and variable attenuators, or vector modulators. The number of RF paths, however, is limited to two or three paths since each additional path requires an additional splitter, combiner, tunable component, gain block and a time delay element. For this reason, only low-order filtering can be performed with known filter systems having two or three paths. What is needed is a two path filter and signal cancellation system that performs high-order filtering, but without needing additional elements such as tunable phase shifters and variable attenuators, or vector modulators for each increase of filter order.

Tunable filters have also been realized in the past with tunable capacitors, such as MEMS, BST and varicap diodes. Heat is dissipated into the tunable components of such known filters, and the Q-factor of tunable capacitors is limited. The limited Q-factor of tunable elements means they cannot be used to filter high-power signals, and large insertion loss results for high-order configurations. What is needed is a filter capable of filtering high-power signals with low insertion loss for high-order configurations.

Known filter banks contain multiple fixed filters and a switch matrix to choose a desired filter configuration. For a large ensemble of filter characteristics, a large number of filters and a large switching matrix is required. The former results in a large space commitment and possesses limited reconfigurability, while the latter results in increasing insertion loss. What is needed is a filter with a small footprint, a continuous range of reconfigurations, and a low insertion loss.

A feed-forward configuration cancellation system with a digital signal processor (DSP) on one path of the filter system has been used to cancel the transmit signal that leaked into the receiver in the transmit passband. The input to the feed-forward system was the digital baseband signal that was also sent to the primary transmitter. The cancellation system is shown in FIG. 2, with this system only the linear portion of the transmitted RF signal can be cancelled. There is a need for a cancellation system that does not only cancel the linear portion of the transmitted RF signal.

Wireless communication systems could include multiband radio architectures, systems capable of spectrum re-farming and software defined radio systems. Common system components in a wireless communication system, such as an IP-based mobile system, include at least one mobile node (or user equipment) and at least one access point AP or a basestation (eNodeB or eNB) on a wireless communication system. The various components on these systems may be called different names depending on the nomenclature used on any particular network configuration or communication system.

For instance, the term "mobile node" includes a mobile communication unit that is called mobile terminal, "smart phones," or nomadic devices such as laptop PCs with wireless connectivity. A "mobile node" or "user equipment" also encompasses PC's having cabled (e.g., telephone line ("twisted pair"), Ethernet cable, optical cable, and so on) connectivity to the wireless network, as well as wireless connectivity directly to the cellular network, as can be experienced by various makes and models of mobile terminals ("cell phones") having various features and functionality, such as Internet access, e-mail, messaging services, and the like.

"Mobile nodes" may sometimes be referred to as user equipment, mobile unit, mobile terminal, mobile device, or similar names depending on the nomenclature adopted by particular system providers. A "receiver" and "transmitter" is located at each "access point" (AP), "basestation," or "user equipment." As such, terms such as transmitter or receiver in the present invention are not meant to be restrictively defined, but could include components on each mobile communication unit or transmission device located on the network.

SUMMARY OF THE INVENTION

The present invention proposes a frequency agile multiple bandstop filter for use on a wireless communication system, multi-band radio architecture, system capable of spectrum re-farming and software defined radio. The system has a large dynamic range which can be used to handle high transmit power, or to handle weak receive signals in the presence of blockers. A notch or bandstop filter is used within the invention to relax the dynamic range requirements of the discrete-time filter when a large dynamic range exists between the passband and desired stopband signals.

The present invention can be used as a tunable filter, but can also be used as a tunable signal cancellation system when the component in the invention's RF path differs from a transmission line. The input signal to the path containing the discrete-time filter is tapped off the main path with a directional coupler from the coupled port. The output signal of this path is combined back into the output of the main path with a directional coupler. A third directional coupler is used to tap-off the combined signal for monitoring. Directional couplers ensure low loss to the main path. In the present invention, an RF component is a low-loss transmission line, a low noise amplifier or a fixed duplexer, and the discrete-time filter is a digital filter.

BRIEF DESCRIPTION OF THE DRAWINGS

Embodiments of the present application will now be described, by way of example only, with reference to the accompanying drawing figures, wherein.

DETAILED DESCRIPTION OF THE PREFERRED EMBODIMENTS

The present invention is a hybrid RF and digital signal processor-based filter for multiband radio architectures, systems capable of spectrum re-farming and software defined radios. The invention can perform low-loss frequency agile multiple bandstop filtering at RF where a large dynamic range exists at the filter input between signals in stopband and passband. At the output of the transmitter the invention can be used to attenuate spurs, or noise within bands with strict emission constraints. At the input to the receiver the invention can be used to attenuate blockers or noise from the transmitter.

The present invention is a reconfigurable system that synthesizes and combines a cancellation signal with the output of an RF or analog component. The cancellation signal is synthesized using the signal tapped-off from the first coupler. The system can operate over a range of carrier frequencies, which means it is frequency agile. At a specific carrier frequency, the system can generate frequency dependent cancellation signals within the system's bandwidth. Frequency agility and the frequency dependent cancellation are the two components that make the system reconfigurable.

The present invention can be used to augment a fixed duplexer, which reduces the manufacturing and production time to market for the augmented duplexer by relaxing the filtering requirements of the fixed duplexer. One augmented duplexer would satisfy the specifications of multiple customers unlike known mechanically tuned filters.

Figure 1:
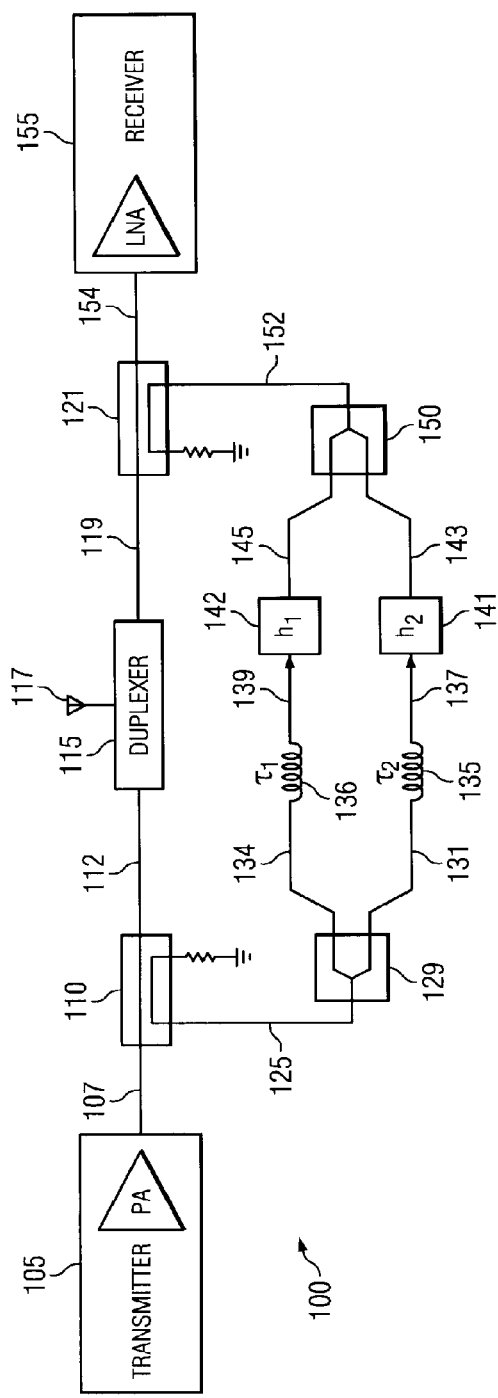
FIG. 1 is a block diagram of a prior art system.

Prior art feed-forward configurations of RF discrete-time filters are available. A known three path RF discrete-time feed-forward filter system is shown in FIG. 1 for improving duplexer isolation. In this figure, $h_1$ and $h_2$ are system blocks containing vector modulators. The symbols labeled $\tau_1$ and $\tau_2$ are fixed delay lines, which classifies this system as discrete-time.

In FIG. 1, a discrete-time feed-forward system 100 having two paths is shown where a transmitter's power amplifier PA 105 provides an input signal to a directional coupler 110 via connection 107. This system is a discrete system made with fixed frequency components, and therefore does not demonstrate frequency agility.

On a first path, the directional coupler 110 is coupled to a splitter 129 via connection 125. The splitter provides two signal paths, which include a connection to delay element one $\tau_1$ 136 via connection 134. Delay element one $\tau_1$ 136 is coupled to RF component h1 142 via connection 139, where the phase and amplitude of the signal are adjusted. On a second signal path from the splitter, a connection to delay element two $\tau_2$ 135 via a connection 131. Delay element two $\tau_2$ 135 is coupled to RF component h2 141 via connection 137, where the phase and amplitude of the signal are adjusted. The output of the RF component h1 142 and RF component h2 141 are coupled to the combiner 150 through connections 145 and 143, respectively. The output of the combiner 150 is coupled to the directional coupler 121 via connection 152.

The directional coupler 110 is coupled on a second path to a duplexer 115. The duplexer 115 is coupled to an antenna 117, and the duplexer is also coupled to the directional coupler 121 via connection 119. The first and the second paths converge at the directional coupler 121, which provides an output signal to the low noise amplifier LNA within the receiver 155 coupled to this filter network via connection 154.

In FIG. 1, the known RF discrete-time filters consist of RF paths containing tunable phase shifters and variable attenuators, or vector modulators. The number of RF paths, however, is limited to two or three paths since each additional path requires an additional splitter, combiner, tunable component, gain block and a time delay element. For this reason, only low-order filtering can be performed with known filter systems having two or three paths. What is needed is a two path filter and signal cancellation system that performs high-order filtering, but without needing additional elements such as tunable phase shifters and variable attenuators, or vector modulators for each increase of filter order.

Figure 2:
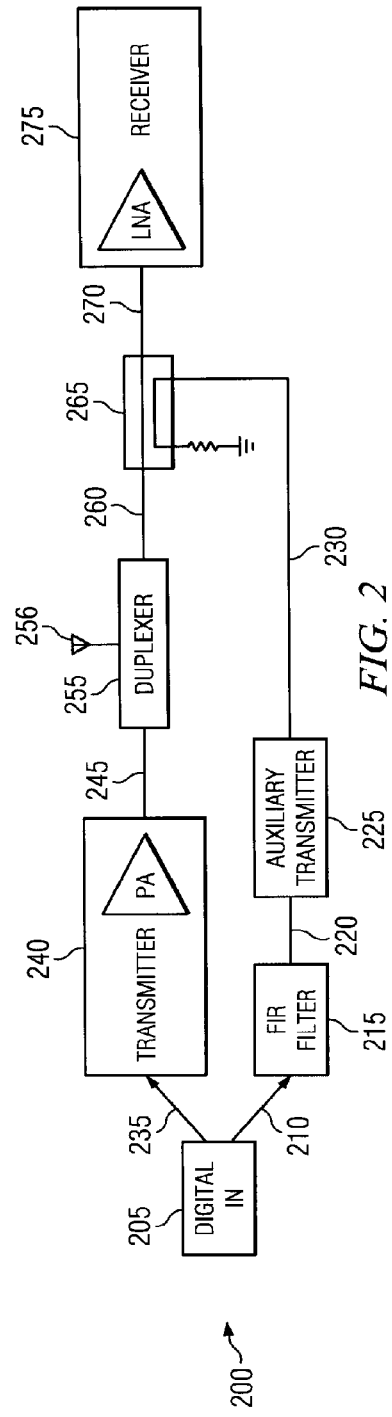
FIG. 2 is a block diagram of a prior art system.

In FIG. 2, a feed-forward system with two paths is shown with a digital filter on one path, which improves duplexer isolation. In FIG. 2, a digital input signal is shown at 205 and split onto a first and a second path. On a first path, the digital signal is sent to an FIR Filter 215 via connection 210, with the output of the FIR Filter 215 being sent to the auxiliary transmitter 225 via connection 220. The output of the auxiliary transmitter 225 is sent to the directional coupler 265 via connection 230.

On a second path, the digital signal is provided to the transmitter 240 via connection 235. The output of the transmitter's power amplifier 240 is provided to the duplexer 255 via connection 245. The duplexer 255 is coupled to an antenna 250, and the duplexer is also coupled to the directional coupler 265 via connection 260. The first and the second paths converge at the directional coupler 265, which provides an output signal to the low noise amplifier LNA within the receiver 275 coupled to this filter network via connection 270.

In FIG. 2, a feed-forward configuration cancellation system with a digital signal processor (DSP) is shown on one path of the filter system, which has been used to cancel the transmit signal that leaked into the receiver in the transmit passband. The input to the feed-forward system was the digital baseband signal that was also sent to the primary transmitter. The cancellation system is shown in FIG. 2, with this system only the linear portion of the transmitted RF signal can be cancelled. There is a need for a cancellation system that does not only cancel the linear portion of the transmitted RF signal.

Figure 3:
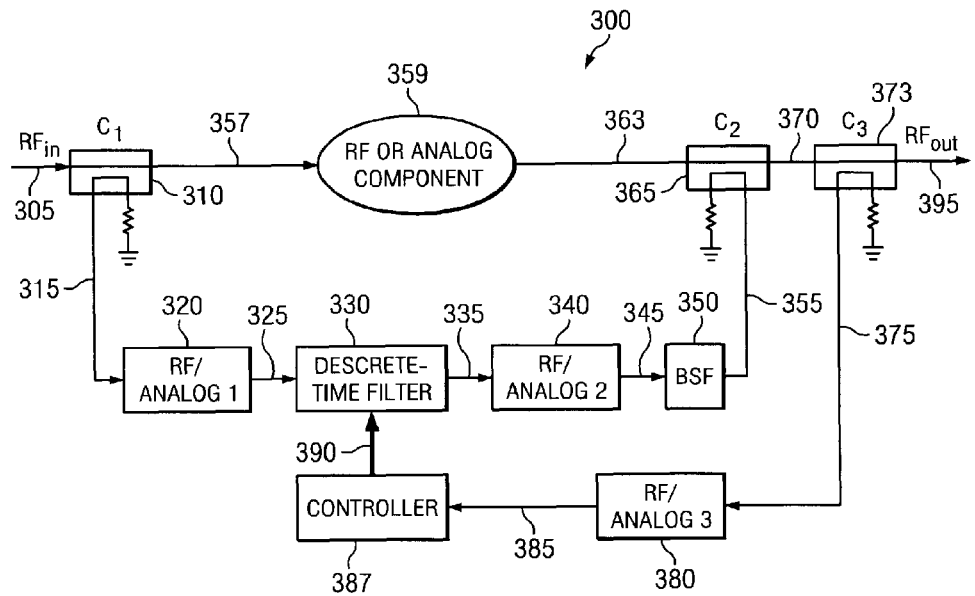
FIG. 3 is a block diagram of the present invention.

An RF (or analog) component or system is connected to the present invention in a feed-forward configuration with one signal path containing a discrete-time filter. This configuration is shown in FIG. 3. The signal path containing the discrete-time filter uses its input signal to synthesize a cancellation signal, which is combined with the RF (or analog) component's output signal. An RF or analog bandstop filter (BSF) or notch filter is also placed in the signal path containing the discrete-time filter to reduce the dynamic range requirements of the discrete-time filter. The combined signal is monitored and used to adaptively reconfigurable the discrete-time filter and other tunable components within the same signal path.

In FIG. 3, the system 300 is shown using the present invention, which includes receiving an input signal $RF_{in}$ 305 (e.g. between 450 MHz to 3500 MHz) coupled to a directional coupler 310. On a first path, the directional coupler 310 is coupled to the RF/Analog 1 frequency down converter 320 via connection 315. The RF/Analog 1 frequency down converter 320 is coupled to a discrete-time filter 330 via connection 325, where the down-converted input signal is input into the discrete-time filter 330. The discrete-time filter 330 coupled to the RF/Analog 2 frequency up converter 340 via connection 335, and the RF/Analog 2 frequency up converter 340 is coupled to the bandstop filter BSF 350 via connection 345. The bandstop filter BSF 350 is coupled to the directional coupler 365 via connection 355.

The directional coupler 310 is coupled on a second path to an RF or analog component 359 via connection 357. The RF or analog component 359 is coupled to the directional coupler 365 via connection 363. The first and the second paths converge at the directional coupler 365, which provides a combined signal to a third directional coupler 373 via connection 370.

A third directional coupler is used to tap-off the combined signal for monitoring. On a third path, the directional coupler 373 is coupled to the RF/Analog 3 frequency down converter 380 via connection 375. The RF/Analog 3 frequency down converter 380 is coupled to a discrete-time filter controller 387 via connection 385. The discrete-time filter controller 387 controls the frequency dependent cancellation of the discrete-time filter 330, which it is connected to via connection 390. The directional coupler 373 is coupled to the output signal $RF_{out}$ 680 for connection to the remainder of the network.

The invention uses two signal paths in a feed-forward configuration with a discrete-time filter in one of the paths. A feed-forward configuration permits the system's passband signal to pass through the RF or analog component and experience minimal loss from the couplers. In one embodiment, the RF component is a low-loss transmission line, then the main path will handle high power if the passband signal is a transmit signal, or will minimally corrupt a weak signal if the passband signal is a receive signal.

Figure 10B:
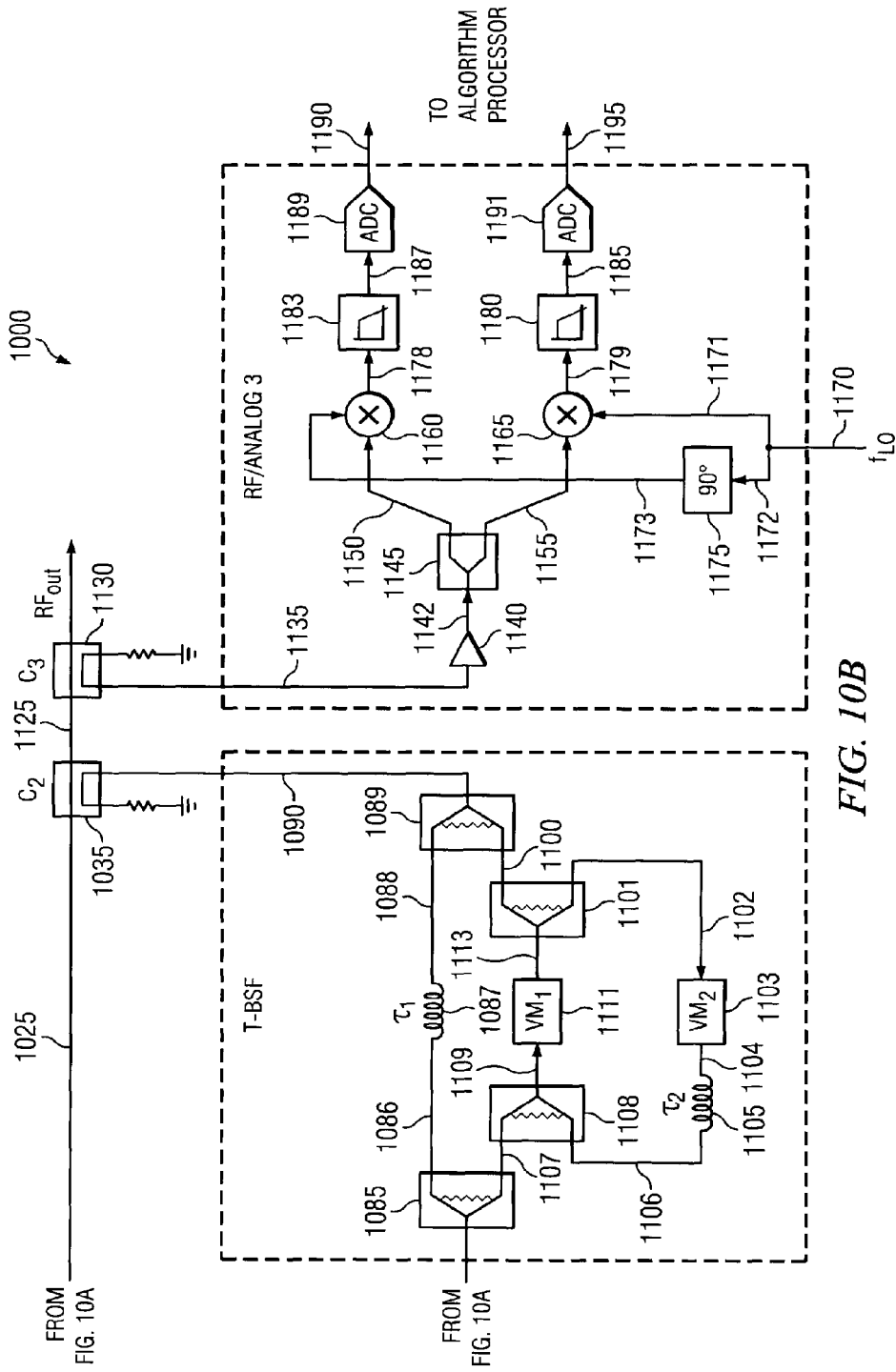

The input signal to the path containing the discrete-time filter is tapped off the main path with a directional coupler from the coupled port. The output signal of this path is combined back into the output of the main path with a directional coupler. A third directional coupler is used to tap-off the combined signal for the monitoring. Directional couplers ensure low loss to the main path. These embodiments with a third directional coupler are shown in FIGS. 3, 4 and 10.

Figure 4:
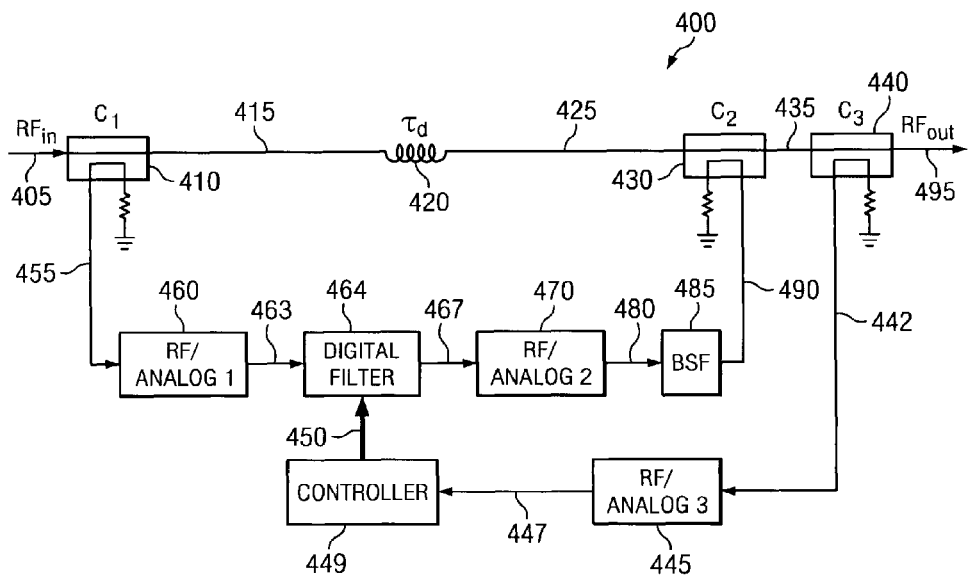
FIG. 4 is a block diagram of the present invention.

In FIG. 4, the system 400 is shown using the present invention, which includes receiving an input signal $RF_{in}$ 405 (e.g. between 450 MHz to 3500 MHz) coupled to a directional coupler 410. On a first path, the directional coupler 410 is coupled to the RF/Analog 1 frequency down converter 460 via connection 455. The RF/Analog 1 frequency down converter 460 is coupled to a digital filter 464 via connection 463, where the down-converted input signal is input into the digital filter 464. The digital filter 464 is a digital filter coupled to the RF/Analog 2 frequency up converter 470 via connection 467, and the RF/Analog 2 frequency up converter 470 is coupled to the bandstop filter BSF 485 via connection 480. The bandstop filter BSF 485 is coupled to the directional coupler 430 via connection 490.

The directional coupler 410 is coupled on a second path to a time delay element $\tau_d$ 420 via connection 415. The time delay element $\tau_d$ 420 is coupled to the directional coupler 430 via connection 425. The first and the second paths converge at the directional coupler 430, which provides a combined signal to a third directional coupler 440 via connection 435.

A third directional coupler is used to tap-off the combined signal for monitoring. On a third path, the directional coupler 440 is coupled to the RF/Analog 3 frequency down converter 445 via connection 442. The RF/Analog 3 frequency down converter 445 is coupled to a digital filter controller 449 via connection 447. The digital filter controller 449 controls the frequency dependent cancellation of the digital filter 464, which it is connected to via connection 450. The directional coupler 440 is coupled to the output signal $RF_{out}$ 495 for connection to the remainder of the network.

In FIG. 10, a more detailed diagram of the invention is shown with component level identifications. In FIG. 10, the system 1000 is shown using the present invention, which includes receiving an input signal $RF_{in}$ 1105 (e.g. between 450 MHz to 3500 MHz) coupled to a directional coupler 1010. On a first path, the directional coupler 1010 is coupled to the RF/Analog 1 frequency down converter via connection 1012. The connection 1012 is coupled to amplifier 1013, which is coupled to a splitter 1015 via connection 1014.

The splitter 1015 is connected to down converter mixers 1026 and 1028 via connections 1016 and 1017, respectively. Down converter mixer 1026 is coupled to the analog low pass filter 1034 via connection 1032, and down converter mixer 1028 is coupled to the analog low pass filter 1036 via connection 1030. The analog low pass filter 1034 is coupled to the analog to digital converter 1044 via connection 1042, and the analog low pass filter 1036 is coupled to the analog to digital converter 1040 via connection 1038.

The RF/Analog 1 frequency down converter is coupled to digital filter 1050, where the down-converted input signal is input into the digital filter 1050. Specifically, the analog to digital converter 1044 is coupled to the digital filter 1050 via connection 1046, and the analog to digital converter 1040 is coupled to the digital filter 1050 via connection 1048.

The digital filter 1050 is a digital filter coupled to the RF/Analog 2 frequency up converter. Specifically, the digital filter 1050 is coupled to digital to analog converter 1056 and digital to analog converter 1059 via connections 1051 and 1052, respectively. The digital to analog converter 1056 is coupled to the analog low pass filter 1062 via connection 1058, and the digital to analog converter 1059 is coupled to the analog low pass filter 1064 via connection 1060.

The analog low pass filter 1062 is coupled to the up converter mixer 1068 via connection 1066. The analog low pass filter 1064 is coupled to the up converter mixer 1070 via connection 1065. Up converter mixer 1068 and up converter mixer 1070 are coupled to the combiner 1080 via connections 1075 and 1078, respectively. The combiner 1080 is coupled to an amplifier 1081 via connection 1079, and the amplifier 1081 is coupled to the bandstop filter via connection 1082.

The bandstop filter is shown in a discrete-time configuration that has an independently tunable transfer function zero and pole. Connection 1082 is coupled to splitter component 1085, which splits the signal into two paths. On the first path from splitter 1085, signal 1107 is transmitted to combiner 1108, which provides a signal along line 1109 to vector modulator VM1 1111, which provides an output signal to the splitter 1101. The splitter 1101 provides two signal, one along line 1102 to vector modulator VM2 1103.

VM2 1103 provides an output to time delay element $\tau_2$ 1105 along line 1104, which provides an output signal from combination with the other input signal of combiner 1108 along line 1106. On the other path from splitter 1101, the second signal is provided on line 1100 to combiner 1089. On the second path from splitter 1085, the second output signal 1086 is provided to time delay element $\tau_1$ 1087, which provides an output signal along line 1088 to combiner 1089. The bandstop filter T-BSF is coupled to the directional coupler 1035 via connection 1090.

Converter mixers are coupled to a local frequency oscillator, $f_{LO}$, which provides a base signal with the frequency of the local oscillator to the converters. The local oscillator controls the frequency agility of the invention. Down converter mixer 1028 and up converter mixer 1070 are coupled to $f_{LO}$ via connections 1020 and 1073 respectively. 90° phase shifter 1022 is coupled to $f_{LO}$ via connection 1021, and 90° phase shifter 1072 is coupled to $f_{LO}$ via connection 1071. 90° phase shifter 1022 is coupled to down converter mixer 1026 via connection 1024, and 90° phase shifter 1072 is coupled to up converter mixer 1068 via connection 1074.

The directional coupler 1010 is coupled on a second path to a time delay element $\tau_d$ 1020 via connection 1015. The time delay element $\tau_d$ 1020 is coupled to the directional coupler 1035 via connection 1025. The first and the second paths converge at the directional coupler 1035, which provides an output signal to a third directional coupler 1130.

A third directional coupler 1130 is used to tap-off the combined signal for the monitoring. On a third path, the directional coupler 1130 is coupled to the RF/Analog 3 frequency down converter via connection 1135. The connection 1135 is coupled to amplifier 1140, which is coupled to a splitter 1145 via connection 1142. The splitter 1145 is connected to down converter mixers 1160 and 1165 via connections 1150 and 1155, respectively. Down converter mixer 1160 is coupled to the analog low pass filter 1183 via connection 1178, and down converter mixer 1165 is coupled to the analog low pass filter 1180 via connection 1179. The analog low pass filter 1183 is coupled to the analog to digital converter 1189 via connection 1187, and the analog low pass filter 1180 is coupled to the analog to digital converter 1191 via connection 1185.

Converter mixers 1165 and 1160 in the RF/Analog 3 frequency down converter are coupled to a local frequency oscillator, $f_{LO}$, which provides a base signal with the frequency of the local oscillator to the down converters. Down converter mixer 1165 is coupled to $f_{LO}$ via connection 1171. 90° phase shifter 1175 is coupled to $f_{LO}$ via connection 1172. 90° phase shifter 1175 is coupled to down converter mixer 1160 via connection 1173.

The RF/Analog 3 frequency down converter is coupled to an algorithm processor from the analog to digital converter 1189 via connection 1190 and from analog to digital converter 1191 via connection 1195, where the digital filter 1050 is provided with input and control signal. The RF/Analog 3 frequency down converter is coupled to a digital filter controller to provide those control signals. The digital filter controller controls the frequency dependent cancellation of the digital filter 1050. The directional coupler 1130 is coupled to the output signal $RF_{out}$ for connection to the remainder of the network.

The discrete-time filter performs the filtering necessary to synthesize a cancellation signal suitable to cancel the undesired signal components present in the main signal path. This filter only needs to operate on the stopband signals and not the passband signals, hence the dynamic range of the signal to be filtered by the discrete-time filter can be less than the dynamic range of the input or output signal of the invention.

The discrete-time filter is preceded with a down-conversion stage and anti-alias filtering, and is followed by reconstruction filtering and an up-conversion stage. A gain stage is used prior to the down-conversion stage to improve the signal path's noise figure. A gain stage is used after the up-conversion stage to ensure the cancellation signals are as large as the signals to be cancelled in the main path.

The notch or bandstop filter relaxes the dynamic range requirements of the discrete-time filter. If placed after the discrete-time filter, then it can be used to reduce the noise in the system's passband. This configuration is beneficial in a receiver. If the notch filter is placed before the discrete-time filter, then it can be used to attenuate a large signal in the system's passband. This configuration is beneficial in a transmitter. In both locations, the notch filter reduces the dynamic range requirements of the other components in the signal path including the discrete-time filter.

The negative group delay circuit takes some of the filtering burden off the DSP filter. Optimization of the DSP filter shows that frequency bands where cancellation is desired have negative group delay in the digital filter's frequency response. By using negative group delay circuits, the digital filter can perform as well as if it had no negative group delay circuits, but with fewer filter taps. Conversely, if the number of filter taps is not reduced, then the negative group delay augmented filter will have more degrees of freedom to optimize a cost function.

A directional coupler and down-conversion stage is located after the cancellation signal is combined with the main path signal. This subsystem is used to monitor the output. This monitored signal is processed, then used to control the adaptation of the digital filter and any tunable components in the system.

The system has a large dynamic range which can be used to handle high transmit power, or to handle weak receive signals. A notch or bandstop filter is used to relax the dynamic range requirements of the discrete-time filter when a large dynamic range exists between the passband and desired stopband signals. In one or more embodiments of the invention, the RF component is a low-loss transmission line, and the discrete-time filter is a digital filter. This embodiment is shown in FIG. 4, and in more detail in FIG. 5. In these embodiments, the invention may be used as a tunable multiple band-stop filter, or multiple notch filter. In this embodiment the invention is in the field of tunable filters, but when the RF component differs from a transmission line, then it is in the field of tunable signal cancellation systems.

Prior to the input of the low noise amplifier the invention can be used to attenuate blockers and transmitter noise outside of the receiver passband. These embodiments are shown in FIGS. 5 through 9. The invention can be used for isolation improvement for components with more than two ports. The invention can be used to cancel transmitter noise that leaks through a fixed duplexer into the receiver in the receiver and transmitter passbands. The invention can be used for linearity relaxation for components along the signal chain in the receiver. The invention can be used to cancel large signals outside of the system's passband at the output of any component. This cancellation will reduce the dynamic range of the signal, hence relax the linearity requirements for the proceeding components.

Figure 5:
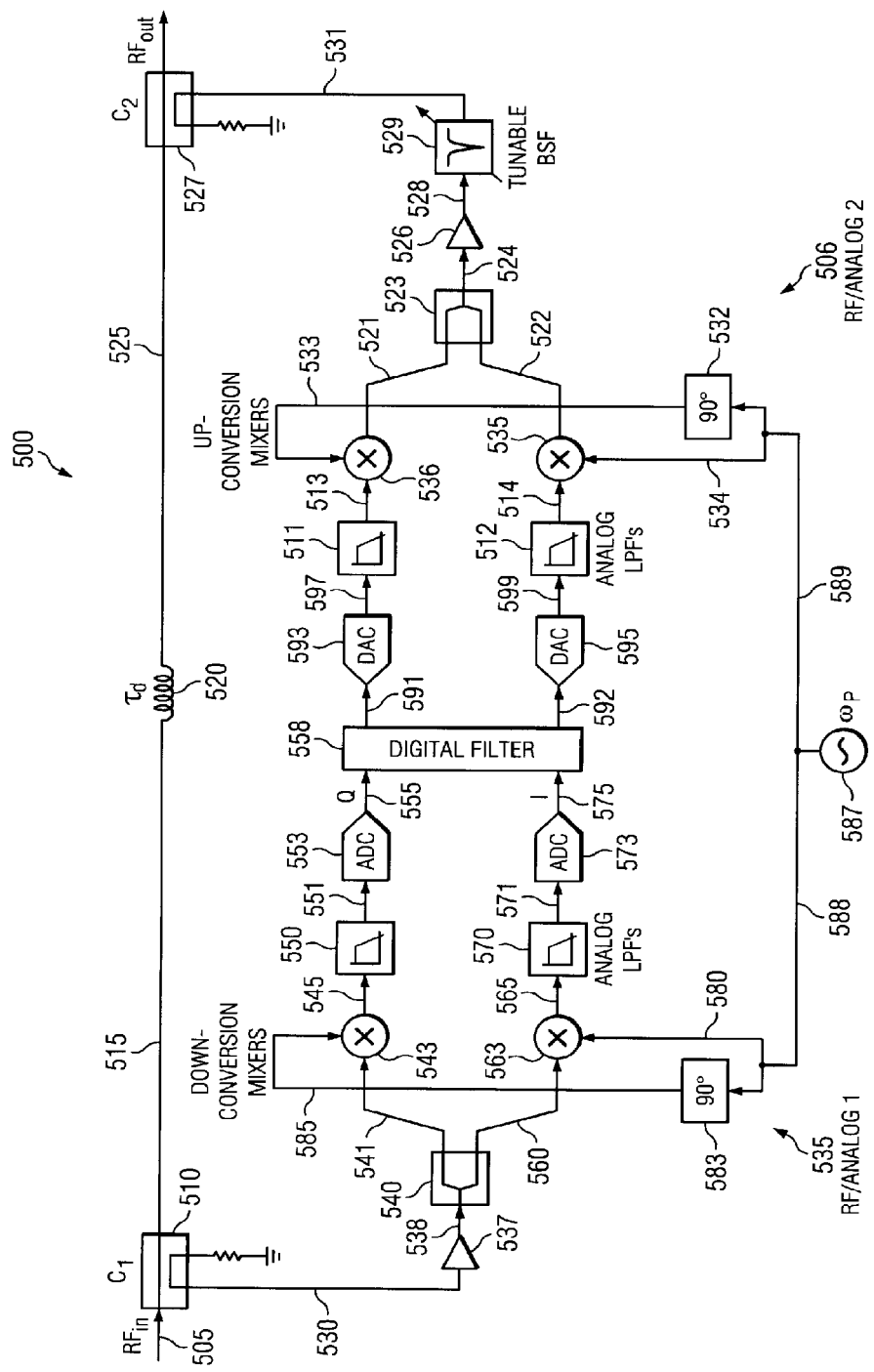
FIG. 5 is a block diagram of the present invention.

In FIG. 5, a detailed diagram for the present invention is shown where the major components are described with more specificity. In FIG. 5, the system 500 is shown using the present invention, which includes receiving an input signal $RF_{in}$ 505 (e.g. between 450 MHz to 3500 MHz) coupled to a directional coupler 510. On a first path, the directional coupler 510 is coupled to the RF/Analog 1 frequency down converter 535 via connection 530. The connection 530 is coupled to amplifier 537, which is coupled to a splitter 540 via connection 538.

The splitter 540 is connected to down converter mixers 543 and 563 via connections 541 and 560, respectively. Down converter mixer 543 is coupled to the analog low pass filter 550 via connection 545, and down converter mixer 563 is coupled to the analog low pass filter 570 via connection 565. The analog low pass filter 550 is coupled to the analog to digital converter 553 via connection 551, and the analog low pass filter 570 is coupled to the analog to digital converter 573 via connection 571.

The RF/Analog 1 frequency down converter 535 is coupled to digital filter 558, where the down-converted input signal is input into the digital filter 558. Specifically, the analog to digital converter 553 is coupled to the digital filter 558 via connection 555, and the analog to digital converter 573 is coupled to the digital filter 558 via connection 575.

The digital filter 558 is a digital filter coupled to the RF/Analog 2 frequency up converter 506. Specifically, the digital filter 558 is coupled to digital to analog converter 593 and digital to analog converter 595 via connections 591 and 592, respectively. The digital to analog converter 593 is coupled to the analog low pass filter 511 via connection 597, and the digital to analog converter 595 is coupled to the analog low pass filter 512 via connection 599.

The analog low pass filter 511 is coupled to the up converter mixer 536 via connection 513. The analog low pass filter 512 is coupled to the up converter mixer 535 via connection 514. Up converter mixer 536 and up converter mixer 535 are coupled to the combiner 523 via connections 521 and 522, respectively. The combiner 523 is coupled to an amplifier 526 via connection 524, and the amplifier 526 is coupled to the bandstop filter 529 via connection 528. Generally, the RF/Analog 2 frequency up converter 506 is coupled to the bandstop filter T-BSF 529 via connection 528. The bandstop filter T-BSF 529 is coupled to the directional coupler 527 via connection 531.

The directional coupler 510 is coupled on a second path to a time delay element $\tau_d$ 520 via connection 515. The time delay element $\tau_d$ 520 is coupled to the directional coupler 527 via connection 525. The first and the second paths converge at the directional coupler 527, which provides an output signal $RF_{out}$ to the remainder of the network.

Converter mixers are coupled to a local frequency oscillator $\omega_p$ 587 which provides a base signal with the frequency of the local oscillator to the down converters. The local oscillator controls the frequency agility of the invention 500. Down converter mixer 563 and up converter mixer 535 are coupled to $\omega_p$ via connections 588 and 589 respectively. 90° phase shifter 583 is coupled to $\omega_p$ via connection 588, and 90° phase shifter 532 is coupled to $\omega_p$ via connection 589. 90° phase shifter 583 is coupled to down converter mixer 543 via connection 585, and 90° phase shifter 532 is coupled to up converter mixer 536 via connection 533.

Figure 6:
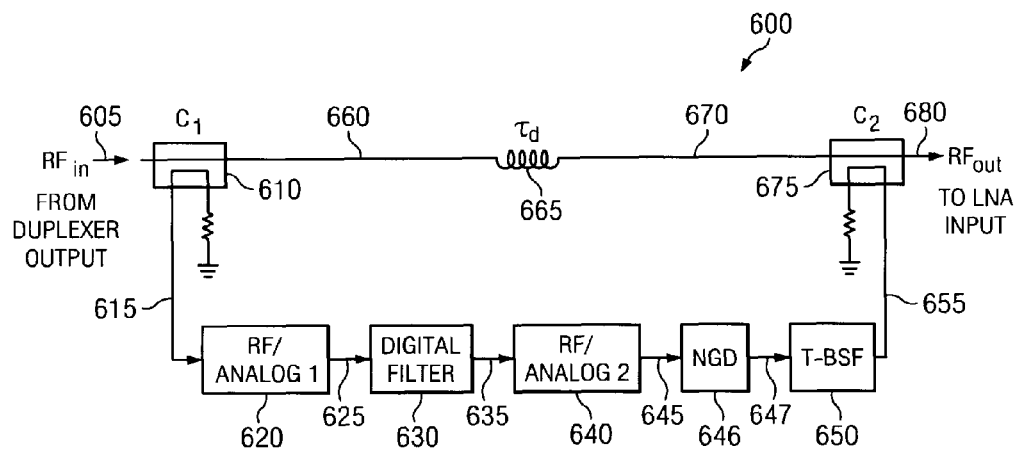
FIG. 6 is a block diagram of the present invention.

In FIG. 6, the system 600 is shown using the present invention, which includes receiving an input signal $RF_{in}$ 605 (e.g. between 450 MHz to 3500 MHz) coupled to a directional coupler 610. On a first path, the directional coupler 610 is coupled to the RF/Analog 1 frequency down converter 620 via connection 615. The RF/Analog 1 frequency down converter 620 is coupled to digital filter 630 via connection 625, where the down-converted input signal is input into the digital filter 630. The digital filter 630 is a discrete-time filter coupled to the RF/Analog 2 frequency up converter 640 via connection 635, and the RF/Analog 2 frequency up converter 640 is coupled to the negative group delay (NGF) element 646 via connection 645.

The NGF element 646 can be a single pole RF discrete time system, comprising a first input signal provided to a first NGF directional coupler via connection 645, which provides a signal along a first signal path through a time delay element to a second NGF directional coupler. The second NGF directional coupler provides a output NGF signal along connection 647 to the bandstop filter T-BSF 650.

The second NGF directional coupler also provides for a feedback signal split along a second pathway from the second NGF directional coupler through an amplifier, a variable phase shifter, a variable gain amplifier and a fixed time delay. This second signal pathway in the NGF element 646 is then coupled back into the first NGF directional coupler on the NGF element 646 to combine with the signal being transferred along the first signal pathway in the NGF element 646.

The bandstop filter T-BSF 650 is coupled to the second directional coupler 675 via connection 655. The first directional coupler 610 is coupled on a second path to a time delay element $\tau_d$ 665 via connection 660. The time delay element $\tau_d$ 665 is coupled to the second directional coupler 675 via connection 670 where the first and second signal pathways are recombined. The first and the second paths converge at the second directional coupler 675, which provides an output signal $RF_{out}$ 680 to the low noise amplifier LNA on the network.

Figure 7:
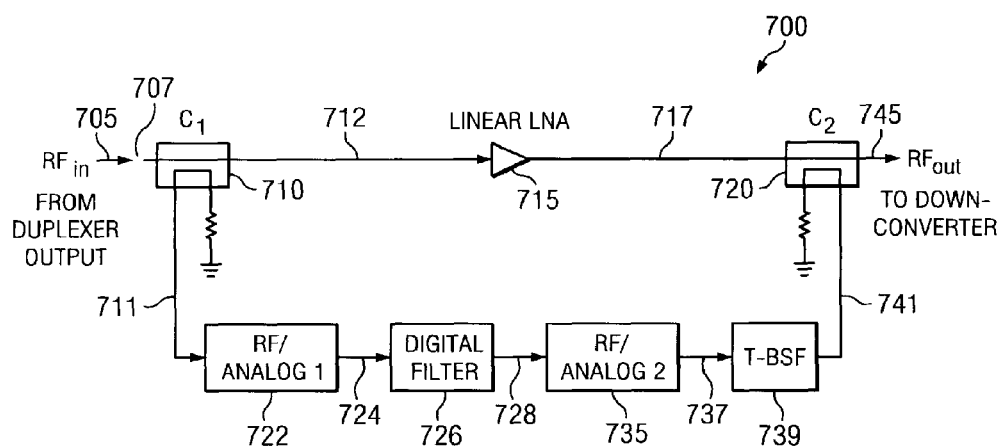
FIG. 7 is a block diagram of the present invention.

In FIG. 7, the system 700 is shown using the present invention, which includes receiving an input signal $RF_{in}$ 705 (e.g. between 450 MHz to 3500 MHz) coupled to a directional coupler 710 via line 707. On a first path, the directional coupler 710 is coupled to the RF/Analog 1 frequency down converter 722 via connection 711. The RF/Analog 1 frequency down converter 722 is coupled to digital filter 726 via connection 724, where the down-converted input signal is input into the digital filter 726. The digital filter 726 is a discrete-time filter coupled to the RF/Analog 2 frequency up converter 735 via connection 728, and the RF/Analog 2 frequency up converter 735 is coupled to the bandstop filter T-BSF 739 via connection 737. The bandstop filter T-BSF 739 is coupled to the directional coupler 720 via connection 741.

The directional coupler 710 is coupled on a second path to the low noise amplifier Linear LNA 715 via connection 712. The low noise amplifier Linear LNA 715 is coupled to the directional coupler 720 via connection 717. The first and the second paths converge at the directional coupler 720, which provides an output signal $RF_{out}$ 745 to the down-converter coupled to this filter network. In this embodiment, interference cancellation is performed prior to the down-converter mixer.

Figure 8:
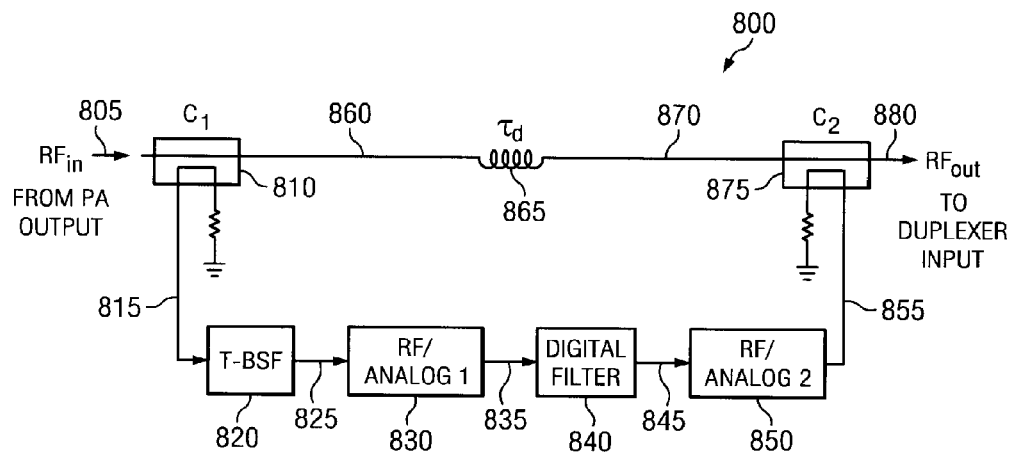
FIG. 8 is a block diagram of the present invention.

In FIG. 8, the system 800 is shown using the present invention, which includes receiving an input signal $RF_{in}$ 805 (e.g. between 450 MHz to 3500 MHz) coupled to a directional coupler 810. On a first path, the directional coupler 810 is coupled to the bandstop filter T-BSF 820 via connection 815. The bandstop filter T-BSF 820 is coupled to the RF/Analog 1 frequency down converter 830 via connection 825. The RF/Analog 1 frequency down converter 830 is coupled to digital filter 840 via connection 835, where the down-converted input signal is input into the digital filter 840. The digital filter 840 is a discrete-time filter coupled to the RF/Analog 2 frequency up converter 850 via connection 845, and the RF/Analog 2 frequency up converter 850 is coupled to the directional coupler 875 via connection 855.

The directional coupler 810 is coupled on a second path to a time delay element $\tau_d$ 865 via connection 860. The time delay element $\tau_d$ 865 is coupled to the directional coupler 875 via connection 870. The first and the second paths converge at the directional coupler 875, which provides an output signal $RF_{out}$ 880 to the duplexer circuit coupled to this filter network. In this embodiment, noise cancellation is performed after the transmitter to perform multiple stopband filtering on the output signal to avoid violating the emission mask, and to cancel transmitter noise in the receiver passband.

Figure 9:
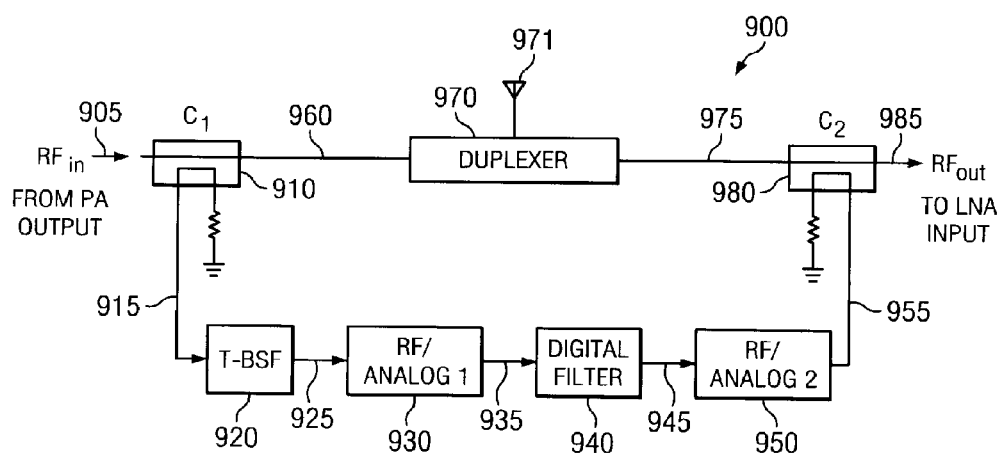
FIG. 9 is a block diagram of the present invention; and,
FIG. 10 is a block diagram of the present invention.

In FIG. 9, the system 900 is shown using the present invention, which includes receiving an input signal $RF_{in}$ 905 (e.g. between 450 MHz to 3500 MHz) coupled to a directional coupler 910. On a first path, the directional coupler 910 is coupled to the bandstop filter T-BSF 920 via connection 915. The bandstop filter T-BSF 920 is coupled to the RF/Analog 1 frequency down converter 930 via connection 925. The RF/Analog 1 frequency down converter 930 is coupled to digital filter 940 via connection 935, where the down-converted input signal is input into the digital filter 940. The digital filter 940 is a discrete-time filter coupled to the RF/Analog 2 frequency up converter 950 via connection 945, and the RF/Analog 2 frequency up converter 950 is coupled to the directional coupler 980 via connection 955.

The directional coupler 910 is coupled on a second path to a duplexer 970 via connection 960. The duplexer 970 is coupled to an antenna 971, and the duplexer is also coupled to the directional coupler 980 via connection 975. The first and the second paths converge at the directional coupler 980, which provides an output signal $RF_{out}$ 985 to the low noise amplifier LNA coupled to this filter network. In this embodiment, transmitter noise cancellation is performed to improve the isolation of a fixed duplexer circuit.

The present invention proposes a hybrid RF-digital signal processing based RF filter and signal cancellation system for use on a wireless communication system, multi-band radio architecture, system capable of spectrum re-farming and software defined radio. The present invention can be used to augment a fixed duplexer, which reduces the manufacturing and production time to market for the augmented duplexer by relaxing the filtering requirements of the fixed duplexer. One augmented duplexer would satisfy the specifications of multiple customers unlike known mechanically tuned filters.

The above-described embodiments of the present application are intended to be examples only. Those of skill in the art may effect alterations, modifications and variations to the particular embodiments without departing from the scope of the application. In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations there from. It is intended that the appended claims cover such modifications and variations as fall within the true spirit and scope of the invention.

What is claimed is:

1. A method of providing frequency dependent signal attenuation, the method comprising:
    splitting an RF input signal into a first signal portion and a second signal portion;
    applying discrete time filtering, a negative group delay and bandstop filtering to the first signal portion to provide a filtered signal portion;
    applying the second signal portion to a component and receiving a component output signal portion from the component;
    combining the component output signal portion with the filtered signal portion to provide an RF output signal having frequency dependent attenuation; and
    applying the negative group delay comprises applying a signal to a negative group delay element, the negative group delay element comprising:
        a first directional coupler configured to couple the signal onto a first signal path; and
        a second directional coupler configured to couple a portion of the signal on the first signal path on a second signal path back to the first directional coupler;
        a time delay element connected between the first directional coupler and the second directional coupler on the first signal path; and
        a phase shifter and an amplifier connected between the second directional coupler and the first directional coupler on the second signal path.

2. The method of claim 1, wherein the phase shifter is a variable phase shifter and the amplifier is a variable gain amplifier.

3. The method of claim 1, wherein the first directional coupler receives a discrete time filtered input signal and the second directional coupler provides an output signal to a bandstop filter.

4. A method of providing frequency dependent signal attenuation, the method comprising:
    splitting an RF input signal into a first signal portion and a second signal portion;
    applying discrete time filtering, a negative group delay and bandstop filtering to the first signal portion to provide a filtered signal portion;
    applying the second signal portion to a component and receiving a component output signal portion from the component;
    combining the component output signal portion with the filtered signal portion to provide an RF output signal having frequency dependent attenuation; and
    applying bandstop filtering comprises processing with a discrete time filter having an independently tunable transfer function zero and pole.

5. The method of claim 4, wherein applying a negative group delay comprises applying a negative group delay at frequencies where attenuation is desired.

6. The method of claim 4, wherein the negative group delay is applied after applying discrete time filtering and before applying bandstop filtering.

7. The method of claim 4, wherein applying negative group delay comprises applying a signal to a negative group delay element, the negative group delay element comprising:
    a first directional coupler configured to couple the signal onto a first signal path; and
    a second directional coupler configured to couple a portion of the signal on the first signal path on a second signal path back to the first directional coupler.

8. The method of claim 4, wherein applying discrete time filtering to the first signal portion comprises:
    down converting the first signal portion to provide a down converted signal portion;
    discrete time filtering the down converted signal portion to provide a discrete time filtered signal portion; and
    up converting the discrete time filtered signal portion.

9. The method of claim 4, wherein applying discrete time filtering and bandstop filtering to the first signal portion to provide a filtered signal portion comprises applying discrete time filtering before applying band stop filtering.

10. The method of claim 4, wherein splitting the RF input signal comprises splitting the RF input signal at a directional coupler.

11. The method of claim 4, wherein combining the component output signal portion with the filtered signal portion comprises combining the component output signal portion with the filtered signal portion at a directional coupler.

12. The method of claim 4, further comprising controlling the discrete time filtering responsive to the RF output signal.

13. The method of claim 12, wherein controlling the discrete time filtering responsive to the RF output signal comprises controlling frequency dependent cancellation of the discrete time filter responsive to the RF output signal.

14. The method of claim 12, wherein controlling the discrete time filtering responsive the RF output signal comprises:
   splitting off a portion of the RF output signal to provide an RF output signal portion; and
   controlling the discrete time filtering responsive to the RF output signal portion.

15. The method of claim 14, wherein controlling the discrete time filtering responsive to the RF output signal portion further comprises:
   down converting the RF output signal portion to provide a down converted output signal portion; and
   controlling the discrete time filtering responsive to the down converted output signal portion.

16. The method of claim 15, wherein controlling the discrete time filtering responsive to the down converted output signal portion comprises:
   providing the down converted output signal portion to a controller;
   processing the down converted output signal in the controller to provide a control signal; and
   providing the control signal to the discrete time filter.

17. The method of claim 14, wherein splitting off a portion of the RF output signal comprises splitting off a portion of the RF output signal at a directional coupler.

18. A method of providing frequency dependent signal attenuation, the method comprising:
   splitting an RF input signal into a first signal portion and a second signal portion;
   applying discrete time filtering, a negative group delay and bandstop filtering to the first signal portion to provide a filtered signal portion;
   applying the second signal portion to a component and receiving a component output signal portion from the component;
   combining the component output signal portion with the filtered signal portion to provide an RF output signal having frequency dependent attenuation;
   applying discrete time filtering and bandstop filtering to the first signal portion to provide a filtered signal portion comprises applying discrete time filtering before applying band stop filtering;
   the RF input signal being received from a duplexer;
   the RF output signal being provided to an RF amplifier of an RF receiver; and
   the component comprises a transmission line between an input of the RF receiver and the RF amplifier of the receiver.

19. The method of claim 18, wherein the RF amplifier is a linear low noise amplifier.

20. The method of claim 18, wherein the transmission line introduces a time delay.

* * * * *